Aug. 13, 1974 W. HUBER ET AL 3,829,316

METHOD FOR THE PREPARATION OF METALLIC LAYERS ON A SUBSTRATE

Filed Dec. 29, 1971

3,829,316

METHOD FOR THE PREPARATION OF METALLIC LAYERS ON A SUBSTRATE

Walther Huber, Altenkunstadt, Heinz Hagen, Neubiberg, and Peter Guglhor, Munich, Germany, assignors to Siemens Aktiengesellschaft, Munich, Erlangen, and Berlin, Germany Filed Dec. 29, 1971, Ser. No. 213,427
Claims priority, application Germany, Jan. 19, 1971, P 21 02 421.5
Int. Cl. C23c 3/00
U.S. Cl. 96—36.2 6 Claims

ABSTRACT OF THE DISCLOSURE

A process for the production of metallic layers on a substrate. Parts of the masking layer and the not needed metallic layer are simultaneously removed. The process is particularly suitable for preparing electrical circuits on ceramic substrates.

The present invention relates to a method for the preparation of at least one structured layer on a substrate which is preferably ceramic.

In a known method for preparing a metallic layer on a substrate, which may consist of silicon, a titanium layer is first evaporated onto a surface of the substrate. The titanium layer, which acts as an adhesion layer on the substrate, is then covered over its entire surface with a gold layer. A masking layer, usually in the form of a photosensitive layer, is then applied on the gold layer. The masking layer is subsequently exposed to the desired structures and developed. The areas of the gold layer thus exposed are etched away. The parts of the titanium layer thereby uncovered are also removed. Finally, the masking layer remaining on the desired metallic structures is stripped from the gold layer.

This method has several individual steps: evaporation of the titanium layer; evaporation of the gold layer; application of the masking layer; etching of the gold layer; etching of the titanium layer; and removal of the remaining masking layer.

It is an object of this invention to provide a method which makes possible the preparation of fine metallic structures on an insulating substrate with fewer and simpler steps, while also making it possible to hard solder the metallic layers.

This object is achieved by the following steps:

(a) application of the metallic layer on the substrate;
(b) application of a masking layer on the metallic layer;
(c) removal of areas of the masking layer whereby the surface of the desired structure of the metallic layer remains covered with the masking layer, with the simultaneous removal of the metallic layer under the removed masking layer; and
(d) removal of the remaining masking layer.

The invention makes possible a simpler manner of providing a metallic layer on a substrate. Only very few procedural steps are required to this end. Furthermore, the structures generated can, if necessary, also be made hard solderable.

A further feature of the invention consists in the removal of the areas of the masking layer and the removal of the areas of the metallic layer not covered by the masking layer with one and the same solvent.

Further characteristics and details of the invention will be seen from the following description of an example of an embodiment with the aid of the Drawing, wherein corresponding parts are given the same reference numerals and in which.

Figure 1:
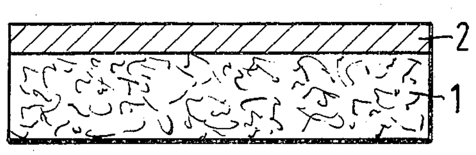
FIG. 1 shows a cross section of a substrate with a metallic layer provided thereon.

Onto a substrate 1, which consists of aluminum oxide, a silicate suspension of at least one of the elements molybdenum and manganese such as a molybdenum manganese silicate suspension, which is provided with Tylose (water soluble cellulose ether) as a binding agent is applied. Upon drying a metallic layer 2 remains on the substrate 1. The binding agent provides here good adhesion of the metallic layer 2 on the substrate 1 (FIG. 1).

Figure 2:
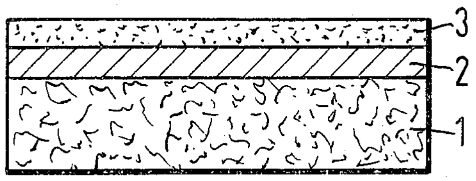
FIG. 2 shows the body of FIG. 1, provided with a masking layer.
Figure 3:
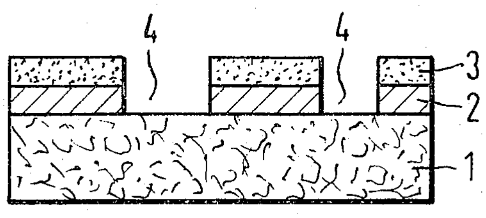
FIG. 3 shows the body of FIG. 2 after removal of parts of the masking layer and the metallic layer.
Figure 4:
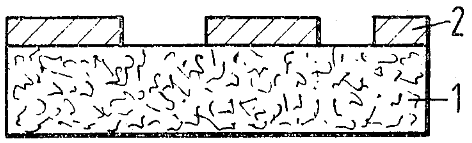
FIG. 4 shows the substrate with the desired metallic layers.

The metallic layer 2 is then coated with a photosensitive layer 3, which acts as the masking layer, as shown in FIG. 2. After exposing the photosensitive layer 3, upon developing the same by a suitable solvent, the parts of the metallic layer 2 exposed by removal of the photosensitive layer are removed with the photosensitive layer. The solvent used must here be capable of dissolving readily the binding agent of the metallic layer, but must not attack the unexposed parts of the photosensitive layer 3. A solution of water and 2% solution hydroxide has been found particularly suitable as the solvent. With this solvent, the exposed parts of the metallic layer 2 can easily be removed by spraying, so that the structure of FIG. 3, showing the pits 4, is generated. Water has also been found to be suitable for removing the metallic layer 2. Finally, the remaining parts of the photosensitive layer 3 are removed by acetone, so that the arrangement with the desired metallic layers 2 on the substrate 1 remains, as shown in FIG. 4. These metallic layers 2 of molybdenum manganese silicate are finally fired into the substrate 1 in a manner known per se.

The method given by the invention is suitable particularly for the preparation of fine and precise, hard solderable metallic layers on a ceramic substrate. Such substrates can be used, for instance, in circuit boards for semiconductor casings or for mounting flip-chips.

What is claimed is:

1. A method for the preparation of at least one structured layer of a silicate suspension of at least one of the elements molybdenum and manganese on a substrate, which comprises (a) applying on the substrate a first layer of a silicate suspension of at least one of the metallic elements molybdenum and manganese, said suspension containing an aqueous solution of a water soluble cellulose ether as a binding agent;
(b) applying a photosensitive masking layer on said first layer and selectively exposing portions of said photosensitive masking layer;
(c) removing in one operation the exposed areas of said masking layer together with said first layer exposed by removal of the exposed areas of said masking layer while the desired structure of said first layer remains covered with the unexposed portions of the masking layer; and (d) removing the remaining portions of said masking layer.

2. The method of claim 1, wherein the removal of areas of the masking layer and the removal of the areas of the metallic layer not covered by the masking layer are achieved by one solvent.

3. The method of claim 2, wherein the binding agent of the metallic layer and the undeveloped photosensitive layer are not attacked by the solvent.

4. The method of claim 3, wherein an aqueous solution of 2% by weight sodium hydroxide is used as the solvent.

5. The method of claim 4, wherein the remaining portions of photosensitive layer are removed with acetone.

6. The method of claim 5, wherein the substrate is ceramic.

References Cited

UNITED STATES PATENTS

| | | | |
|---|---|---|---|
| 3,639,185 | 2/1972 | Colom et al. | 96—36.2 |
| 3,637,383 | 1/1972 | Hallman et al. | 96—36.2 |
| 3,418,144 | 12/1968 | Culp et al. | 117—107.2 R |
| 3,615,465 | 10/1971 | Bullinger | 96—36.2 |
| 3,516,346 | 6/1970 | Schaefer et al. | 96—36.2 |

CHARLES E. VAN HORN, Primary Examiner

J. W. MASSIE, Assistant Examiner

U.S. Cl. X.R.

117—70 S, 212, 215; 156—3